United States Patent
Fries

(10) Patent No.: US 7,179,680 B2
(45) Date of Patent: Feb. 20, 2007

(54) METHOD FOR PRODUCING AN OPTOELECTRONIC COMPONENT

(75) Inventor: Manfred Fries, Hunderdorf (DE)

(73) Assignee: Infineon Technologies AG, Munich (DE)

( * ) Notice: Subject to any disclaimer, the term of this patent is extended or adjusted under 35 U.S.C. 154(b) by 109 days.

(21) Appl. No.: 10/695,580

(22) Filed: Oct. 28, 2003

(65) Prior Publication Data
US 2004/0085609 A1 May 6, 2004

(30) Foreign Application Priority Data
Oct. 29, 2002 (DE) ................. 102 50 540

(51) Int. Cl.
| | |
|---|---|
| H01L 21/00 | (2006.01) |
| H01L 29/06 | (2006.01) |
| H01L 31/113 | (2006.01) |
| H01L 23/02 | (2006.01) |
| H01L 23/28 | (2006.01) |
| H01L 23/29 | (2006.01) |

(52) U.S. Cl. .................. 438/106; 438/116; 257/13; 257/21; 257/79; 257/294; 257/678; 257/787; 257/794

(58) Field of Classification Search .............. 438/22, 438/112, 116; 257/99, 100, 79, 80, 98, 116, 257/117, 118, 294
See application file for complete search history.

(56) References Cited

U.S. PATENT DOCUMENTS

| | | | | |
|---|---|---|---|---|
| 3,432,783 | A | * | 3/1969 | Britton et al. .............. 335/216 |
| 4,202,226 | A | | 5/1980 | Becker et al. |
| 4,313,355 | A | | 2/1982 | Becker et al. |
| 5,030,321 | A | * | 7/1991 | Coutandin et al. ............ 216/24 |
| 5,337,397 | A | * | 8/1994 | Lebby et al. .................. 385/93 |
| 5,428,704 | A | | 6/1995 | Lebby et al. |
| 5,500,540 | A | | 3/1996 | Jewell et al. |
| 5,504,350 | A | * | 4/1996 | Ortyn .......................... 257/81 |
| 5,903,243 | A | * | 5/1999 | Jones ............................. 345/7 |
| 5,907,162 | A | | 5/1999 | Maruyama |
| 6,084,175 | A | * | 7/2000 | Perry et al. .................. 136/256 |
| 6,225,139 | B1 | * | 5/2001 | Tsung-Wen .................. 438/26 |
| 6,243,350 | B1 | * | 6/2001 | Knight et al. ............... 369/126 |
| 6,309,566 | B1 | | 10/2001 | Müller et al. |

(Continued)

FOREIGN PATENT DOCUMENTS

DE   34 12 766 A1   10/1985

(Continued)

OTHER PUBLICATIONS

English translation of previously filed Japanese Utility Model JP 59-91764, dated Jun. 21, 1984.

Primary Examiner—Carl Whitehead, Jr.
Assistant Examiner—James M. Mitchell
(74) Attorney, Agent, or Firm—Laurence A. Greenberg; Werner H. Stemer; Ralph E. Locher

(57) ABSTRACT

An optoelectronic component with an optoelectronic transducer is produced with the novel method. The optoelectronic component has a coupling region, which is formed in a radiation-transparent molding of the optoelectronic component. On the base of a clearance of the coupling region, the optoelectronic component has a radiation-optical functional surface, which is formed from the housing material and introduced into the molding with the aid of a profile milling cutter.

10 Claims, 5 Drawing Sheets

U.S. PATENT DOCUMENTS

| | | | |
|---|---|---|---|
| 6,706,554 B2 * | 3/2004 | Ogura | 438/106 |
| 6,749,925 B2 * | 6/2004 | Hoppe et al. | 428/167 |
| 6,769,969 B1 * | 8/2004 | Duescher | 451/59 |
| 2001/0007513 A1 * | 7/2001 | Koshimizu et al. | 359/811 |
| 2003/0002272 A1 * | 1/2003 | Suehiro et al. | 362/84 |
| 2003/0035361 A1 * | 2/2003 | Knight et al. | 369/112.24 |
| 2003/0097741 A1 * | 5/2003 | Feldman et al. | 29/26 A |
| 2003/0156307 A1 * | 8/2003 | Schuck et al. | 359/21 |
| 2004/0008952 A1 | 1/2004 | Kragl | |
| 2004/0081409 A1 * | 4/2004 | Ho | 385/92 |
| 2005/0286840 A1 * | 12/2005 | Ho et al. | 385/92 |

FOREIGN PATENT DOCUMENTS

| | | | |
|---|---|---|---|
| DE | 199 09 242 A1 | | 8/2000 |
| DE | 100 65 624 A1 | | 7/2002 |
| JP | 59-91764 | | 6/1984 |
| JP | 362114249 | * | 5/1987 |
| JP | 63065683 A | | 3/1988 |
| JP | 03-174992 | * | 7/1991 |
| JP | 04002179 A | | 1/1992 |
| JP | 08 122 583 | | 5/1996 |
| JP | 08306959 A | | 11/1996 |
| JP | 022003103412 | * | 4/2003 |

* cited by examiner

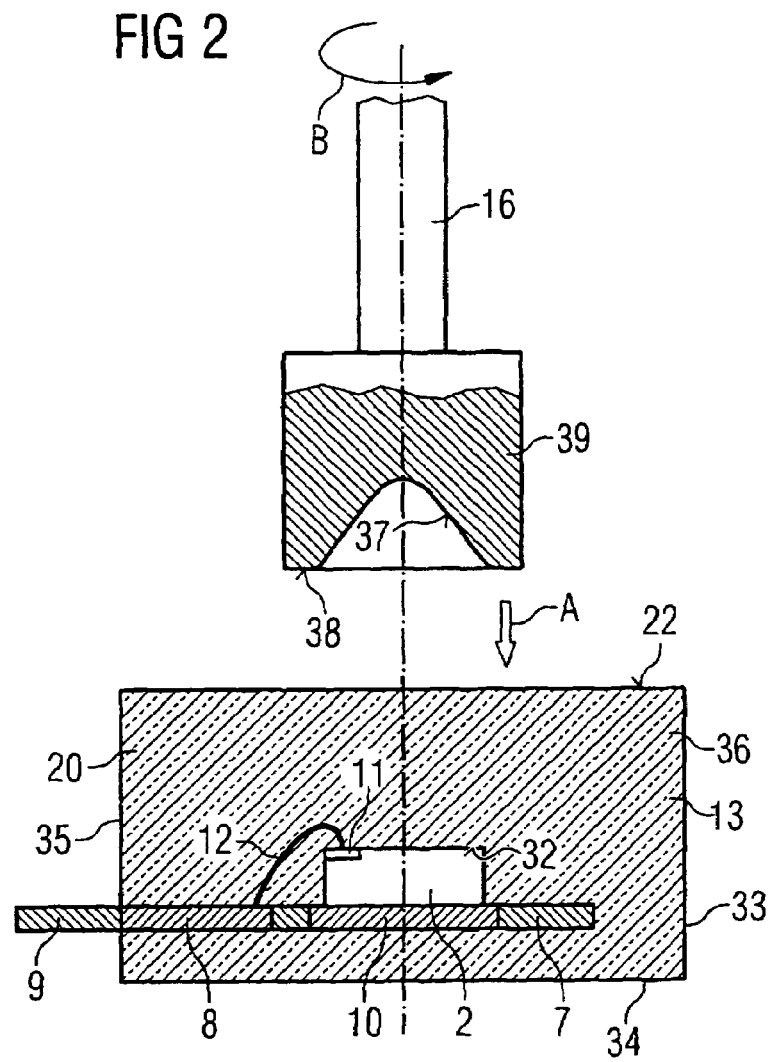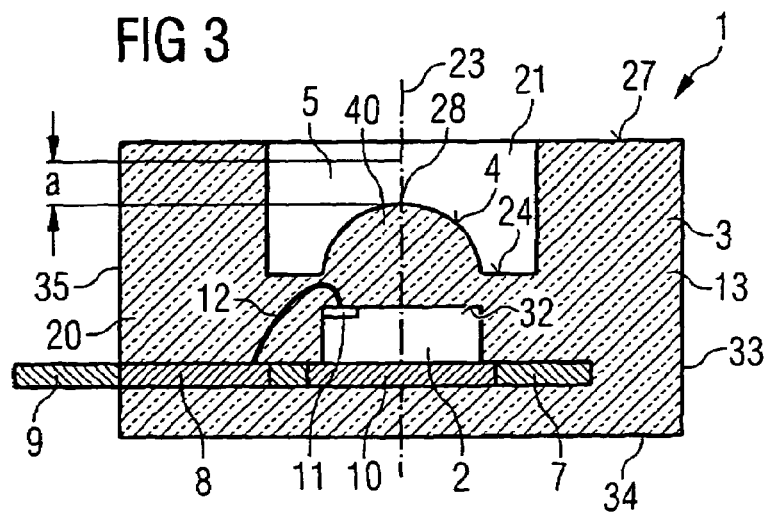

METHOD FOR PRODUCING AN OPTOELECTRONIC COMPONENT

BACKGROUND OF THE INVENTION

Field of the Invention

The invention relates to a method for producing an optoelectronic component which has an optoelectronic transducer in a plastic housing. The plastic housing is partly transparent to radiation.

Such optoelectronic components are known for example from Japanese published patent applications JP 63-65683 A, JP 04-2179 A, and JP 08-306959 A, as well as from Japanese utility model JP 59-91764 U1.

Optoelectronic components are produced in large numbers. German published patent application DE 199 09 242 A1 discloses a method and a casting mold for producing an optoelectronic module, with an optoelectronic transducer being embedded by a casting technique in a plastic housing made of radiation-transparent plastic. The transducer may be both an optoelectronic emitter, such as an infrared diode or a laser, and an optoelectronic receiver, such as a CCD circuit or a radiation-sensitive diode. These transducers are often problematical in radiation-optical terms.

In addition, U.S. Pat. Nos. 5,907,162 and 5,500,540, as well as German published patent application DE 34 12 766 A1 disclose further methods for producing optical components.

SUMMARY OF THE INVENTION

It is accordingly an object of the invention to provide a method for producing an optoelectronic component which overcomes the above-mentioned disadvantages of the heretofore-known devices and methods of this general type and which method can be carried out reliably and leads to optoelectronic components that are improved in radiation-optical terms.

With the foregoing and other objects in view there is provided, in accordance with the invention, a method for producing an optoelectronic component, which comprises:

providing an optoelectronic transducer mounted on a support with inner flat conductors and outer flat conductors;

embedding the transducer and the inner flat conductors in a plastic housing; and milling the plastic housing to form a radiation-optical functional surface for a coupling partner from a material of the plastic housing.

In other words, the invention provides for an advantageous method of producing an optoelectronic component. An optoelectronic component of this type comprises at least one optoelectronic transducer in a housing, which for its part has a functional surface in a coupling region. This coupling region is provided for a coupling partner, such as an optical waveguide or laser diode. An optoelectronic transducer is understood in this context as meaning a transducer which converts signals, based on electromagnetic waves, such as thermal radiation, infrared radiation, X-ray radiation or visible light, into electrical signals. The method for producing an optoelectronic component of this type has the following method steps.

Firstly, a support with inner and outer flat conductors and with the optoelectronic transducer is provided on a chip island of the support. Subsequently, the electrodes of the optoelectronic transducer are connected to the inner flat conductors and/or to the chip island. Subsequently, the inner flat conductors, the transducer and the wiring are embedded in a molding, the molding partly comprising a radiation-transparent material which is adapted in its transparency to the wavelength of the radiation-optical components, such as the transducer, and the coupling partner. Finally, a radiation-optical functional surface is incorporated into the radiation-transparent molding, which is performed by means of profile milling of the coupling region with the functional surface being aligned with the transducer.

For introducing and aligning the functional surface, a planar or concave milling cutter may be used. During the milling, there forms in the radiation-transparent molding a radiation-transparent functional surface, which in the case of a concave milling cutter forms a lens surface which concentrates the optical radiation onto the transducer. With the milling operation, an outer enclosing radiation-proof and mechanically protective coating of the radiation-transparent molding can be removed in a defined manner to form the coupling region for a coupling partner.

The milling additionally has the advantage that, at the same time as the shaping of the surface of the radiation-optical functional surface, the coupling region for the coupling partner is produced and there is no need for the subsequent removal of a plug for the forming of a radiation-optical functional surface, as in the case of the aforementioned casting method, the so-called CAI (cavity and interface) method. Furthermore, the milling technique prevents a defective plug fit, which leads to mismatches between the radiation-optical functional surface and the transducer. A further advantage is the easy variation of the lens geometry by using different milling cutter geometries.

With the method according to the invention, at the same time the risk of air bubbles being entrapped at undercuts during the forming of lenses, as exists in the case of the casting technique with a plug, is avoided, since undercuts are avoided when the inner flat conductors and the transducer as well as the wiring are embedded into a radiation-transparent molding according to the invention.

Instead of the introduction of a coupling region by means of profile milling, an outer enclosure with a guiding stub for the coupling partner can be diecast on the molding before the profile milling. In the case of this variant of the method, the profile milling is restricted to the forming of a precise radiation-optical guiding surface, while the diecasting of the outer enclosure with a guiding stub undertakes the guiding of the coupling partner in the direction of the radiation-transparent functional surface.

In the case of a further variant of the method, it is provided that a mold which already has a guiding stub is provided, although said guiding stub is separated from the region for the forming of a molding by a separating wall. A mold of this type, having two regions, has the advantage that no plastics compound can penetrate into the guiding stub, and consequently impair the function of the guiding stub, during the casting of the moldable radiation-transparent plastics compound for embedding the inner flat conductors, the transducer and the wiring. During the subsequent profile milling with the introduction of the functional surface, a through-opening to the radiation-transparent molding is milled into the separating wall. As this happens, a stop face which limits the introduction of the coupling partner into the guiding stub can advantageously be formed, so that an optimum distance between a vertex point of the radiation-optical guiding surface and an end face of the coupling partner is maintained.

In the case of a further refinement of the method, the separating wall which separates the guiding stub from the molding region during the casting of the molding may be formed by a plug which is removed before the profile milling. This plug can facilitate access to the radiation-transparent molding when the milling tool is introduced, because only little material needs to be milled away.

An optoelectronic component produced by this method has the following features. The optoelectronic component has an optoelectronic transducer, which is embedded in a plastic housing which is of a substantially cuboid form on the outer side. This cuboid plastic housing is formed from a resin or a molding compound which is radiation-transparent in the region of the radiation guide. For this purpose, the optoelectronic transducer is arranged on a support, which has outer flat conductors which protrude out of the plastic housing. On these outer flat conductors, the transformed electronic signals which are triggered by corresponding radiation-optical signals can be picked up, or electronic signals can be supplied on these outer flat conductors to the transducer, so that the latter emits radiation-optical signals.

The plastic housing has a clearance which is formed as a coupling region and can receive a corresponding radiation-optical coupling partner. This radiation-optical partner may be a fiber-optic line or a radiation emitter, which can be arranged in the coupling region. The clearance for receiving a coupling partner is formed on one of the sides of the cuboid of the plastic housing formed in a cuboidal manner. The radiation-optical axis of the transducer is aligned orthogonally in relation to the cuboid side with the clearance. Arranged on the base area of the clearance is a functional surface of the plastics compound, formed axially symmetrically in relation to the optical axis.

This optoelectronic component has the advantage that its outer surfaces form sides of a cuboid, so that the molding can be cast from radiation-transparent plastic without undercuts. This avoids in particular the occurrence of air bubbles entrapped in the molding. A further feature of the plastic housing of this optoelectronic component is that the surfaces of the cuboid do not have projections, so that the cast molding can be realized in a simple casting mold and can be removed from the casting mold once the molding has solidified. A further advantage is that the clearance for forming a coupling region and an axially symmetrical radiation-transparent functional surface can be introduced into a relatively smooth outer side of the cuboid plastic housing.

A radiation-transparent core of the plastic housing comprises a material which is adapted to the radiation of the wavelength that can be processed by the optoelectronic transducer. For a transducer for converting optical signals in the near infrared range or in the visible light range, the plastic housing comprises an acrylic resin or radiation-transparent epoxy resin.

The radiation-transparent molding may form a core of the plastic housing of the optoelectronic component which is surrounded by a non-radiation-transparent coating. A plastic housing of this type can be realized by two successive molding processes, in that firstly the radiation-transparent core is applied and subsequently this radiation-transparent core is enclosed by a non-radiation-transparent coating by means of a second molding process. A non-radiation-transparent enclosure of this type has the advantage that it forms a mechanical protection for the radiation-transparent core. Subsequent introduction of the clearance with an axially symmetrical radiation-optical functional surface in relation to the radiation-optical axis of the transducer has the advantage that an optoelectronic access to the transducer can be created in a simple way by means of a milling technique.

This outer enclosure comprising a non-radiation-transparent coating may have a guiding stub as an extension of the coupling region of the clearance. This guiding stub is arranged coaxially in relation to the radiation-optical axis. Consequently, it is ensured by the guiding stub that a coupling partner can be inserted into the plastic housing exactly on the radiation-optical axis in relation to the radiation-optical transducer. Furthermore, the optoelectronic component may have within the guiding stub a stop face which is aligned axially symmetrically in relation to the radiation-optical axis. A stop face of this type within the guiding stub is accompanied by the advantage that an optimum distance between the transducer and the radiation-optical coupling partner is maintained.

Furthermore, a minimum distance between the vertex point of the functional surface and the stop face of 10 µm to 100 µm can be maintained, so that the radiation-optical functional surface is not damaged when the coupling component is inserted. Furthermore, a distance of between 40 µm and 60 µm is provided, which on the one hand ensures that it is large enough not to bring about any damage to the radiation-optical functional surface even when the coupling partner is exchanged, and is nevertheless small enough to ensure optimum coupling on.

In summary, for the connection of an optical waveguide, a POF (plastic optical fiber) conductor with a semiconductor component with a defined surface in the form of a radiation-optical functional surface and an exact-fitting mounting by means of a correspondingly formed coupling region is advantageous. The shaping of this radiation-optical functional surface may be performed by forming a planar surface or, to increase the range of the optical coupling, in the form of an optical lens. The radiation-optical functional surface forms an interface, which is aligned with the mounting in the coupling region precisely with the transducer, for example in the form of a photodiode or a transmitter component, such as an LED (light emitting diode), the invention disclosing a method wherein variously shaped radiation-optical functional surfaces can be introduced into a component in a simple way in the form of a clearance.

In this case, a small distance in structural terms can be realized between a vertex point of the radiation-optical surface, for example a lens vertex, and the transducer surface of the semiconductor chip mounted on a support, especially since the shaping of the radiation-optical functional surface is performed by introducing a clearance into a plastic housing for relatively smooth surfaces. The milling technique according to the invention allows the semiconductor chip with its wiring to be arranged partly in the region of the lens, with the distance between the semiconductor and the lens vertex point being minimized.

Other features which are considered as characteristic for the invention are set forth in the appended claims.

Although the invention is illustrated and described herein as embodied in a method for producing an optoelectronic component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a schematic cross section through a blank of an optical component;

FIG. 3 is a schematic cross section through a completed optoelectronic component;

DESCRIPTION OF THE PREFERRED EMBODIMENTS

Figure 1:
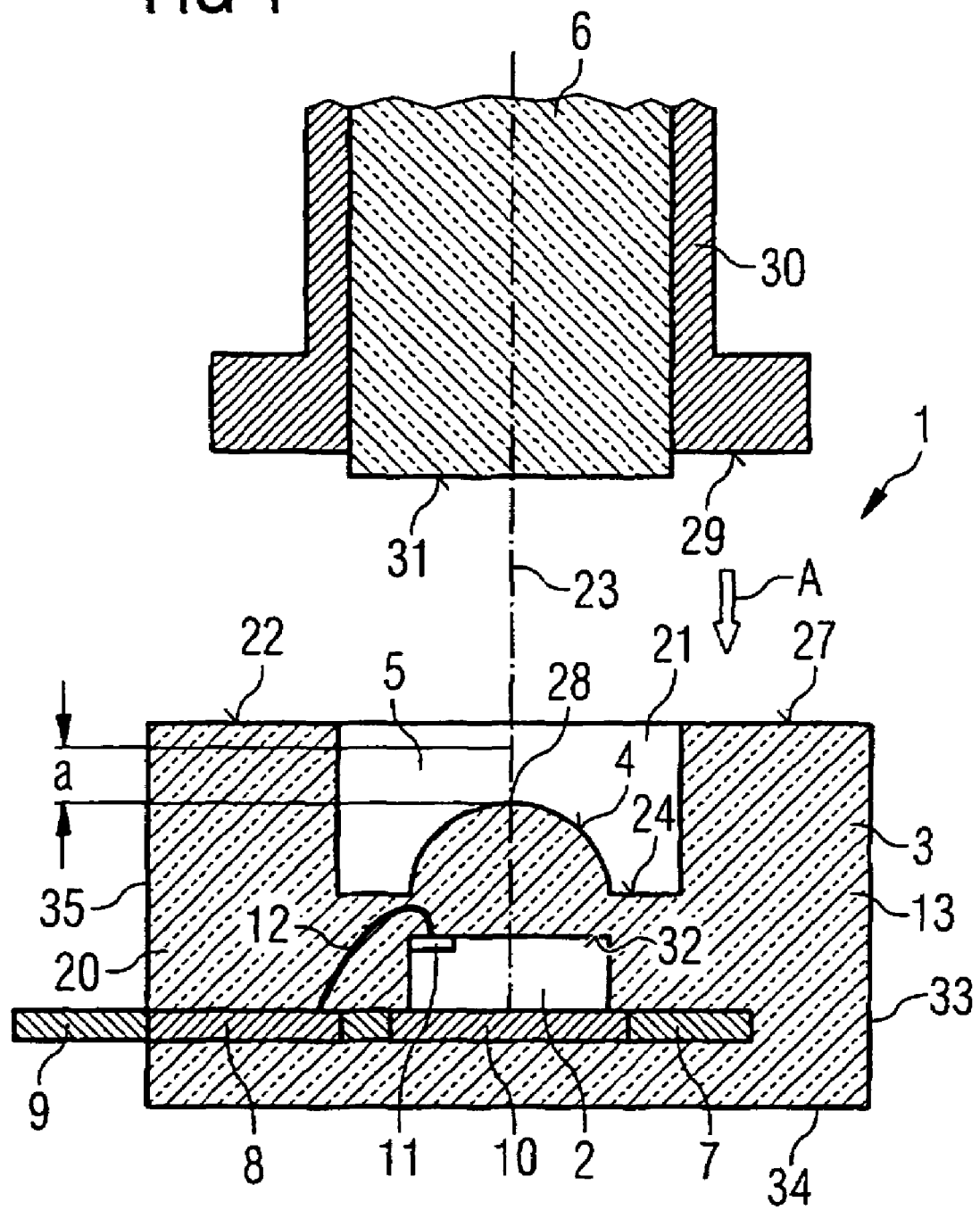
FIG. 1 is a schematic cross section through an optoelectronic component and a coupling partner, produced according to the invention, before they are joined together.

Referring now to the figures of the drawing in detail and first, particularly, to FIG. 1 thereof, there is shown a cross section through an optoelectronic component 1 and through a coupling partner 6. The optoelectronic component 1 has a housing 3 formed of a radiation-transparent molding 13. Arranged in the molding 13 of a radiation-transparent material is an optoelectronic transducer 2. The transducer 2 is fixed on a chip island 10, which is connected via an inner flat conductor 8 to an outer flat conductor 9, to which electrical signals are applied or from which electrical signals are taken.

The transducer 2 has on its active upper side 32 two electrodes, of which only one electrode 11 is visible here. The electrode 11 is connected by means of a wiring 12 to a non-illustrated further inner flat conductor and outer flat conductor. The radiation-optical axis 23 of the radiation-transparent molding 13 is aligned orthogonally in relation to a cuboid side 22. The further cuboid sides 33 to 35 bound the cross section shown in FIG. 1 of the cuboid molding 13. The cuboid side 22 has a clearance 21, which has on the base 24 of its clearance a radiation-optical functional surface 4 as an optical lens. The clearance 21 serves at the same time as a coupling region 5 for the coupling partner 6.

For the coupling of the coupling partner 6 onto the optoelectronic transducer 2, the coupling partner 6 is arranged in the clearance 21 in such a way that a minimum distance a forms between an end face 31 of the coupling partner 6 and the vertex point 28 of the radiation-optical functional surface 4. For attaching the coupling partner 6 in the clearance 21, the lug 29 may be adhesively bonded or welded onto the cuboid side 22. For this purpose, the coupling partner 6 is lowered in the direction of the arrow A and inserted into the clearance 21 of the coupling region 5. As this happens, the cuboid side 22 serves at the same time as a stop face 27.

To avoid repetition, components with the same functions as in FIG. 1 are identified in the following FIGS. 2 to 9 by the same designations.

FIG. 2 shows a schematic cross section through a blank 36 of an optoelectronic component. The blank 36 has a radiation-transparent molding 13 with smooth cuboid sides 22, 33, 34 and 35 and it encloses an optoelectronic transducer 2, which is arranged on a chip island 10 and is supplied with electrical signals or emits electrical signals via an inner flat conductor 8 and an outer flat conductor 9. Arranged axially symmetrically in relation to the radiation-optical axis 23 of the transducer above the blank 36 is a milling head 39, the milling face 37 of which forms a concave form, while its milling face 38 forms a planar, disk-shaped milling face. Under rotational movement in the direction B, the profile milling cutter 16 is lowered in the direction of the radiation-optical axis 23 onto the cuboid face 22 of the blank 36 and thereby produces a clearance.

FIG. 3 shows a schematic cross section through an optoelectronic component 1 which corresponds to the optoelectronic component 1 in FIG. 1 and shows the result of the milling operation represented in FIG. 2. The lowering of the milling head 39 has the effect of producing an exactly aligned lens 40, which corresponds in radiation-optical terms to a converging lens on the base 24 of the clearance 21. This lens 40 intensifies the radiation-optical effect between the optoelectronic transducer 2 and the coupling partner 6 shown in FIG. 1.

Figure 4:
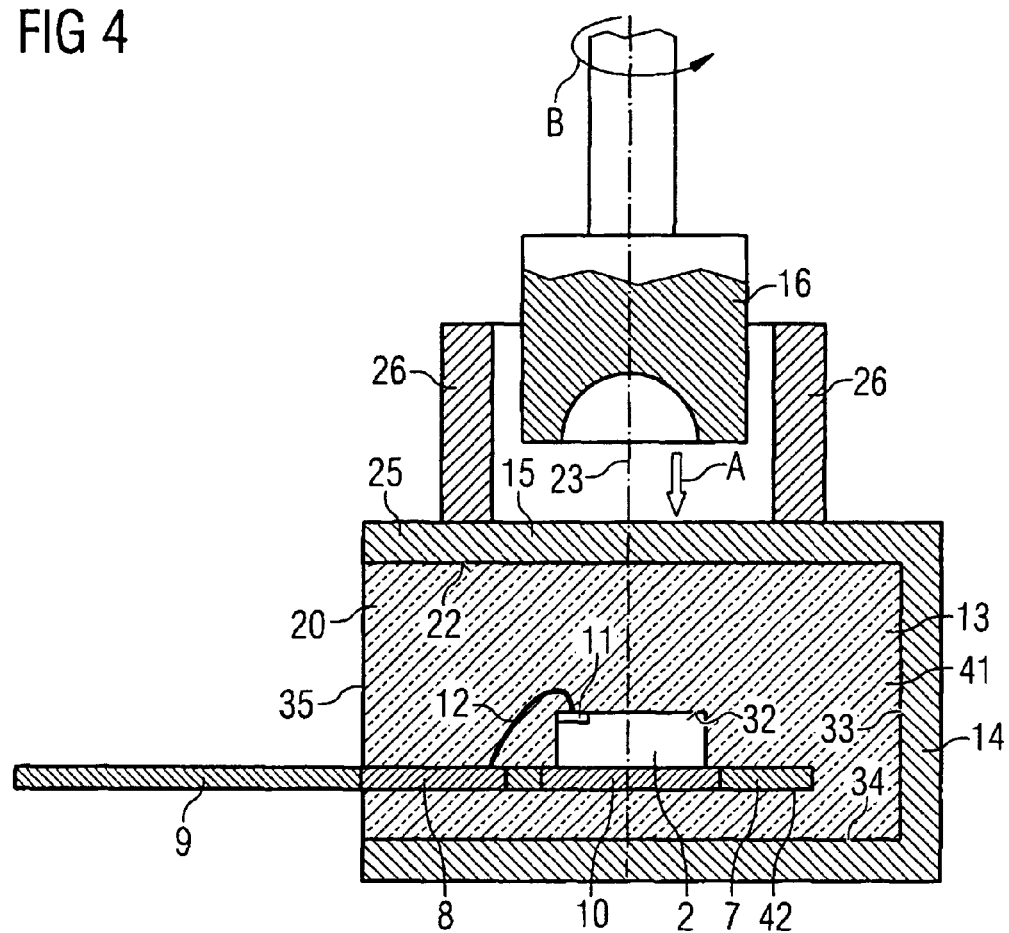
FIG. 4 is a schematic cross section through a mold for an optoelectronic component.

FIG. 4 shows a schematic cross section through a mold 14 for an optoelectronic component. The mold 14 has a cuboid cavity 41. This cavity is open toward the cuboid side 35, so that an optoelectronic transducer 2 on a flat-conductor frame 42 can be introduced from the open cuboid side 35 before or after the cavity is filled with a radiation-transparent plastic. After the flat-conductor frame 42 with an optoelectronic transducer 2 and a wiring 12 has been introduced, these components are embedded into a transparent plastic in the cavity 41 and the plastic is cured, so that a radiation-transparent molding 13 is formed.

Apart from the cavity 41, the mold 14 also has a guiding stub 26, which can receive a coupling partner. The guiding stub 26 is arranged axially symmetrically in relation to the radiation-optical axis 23 of the optoelectronic transducer 2 on the cuboid side 22 of the molding 13. The mold 14 forms a separating wall 15 between the guiding stub 26 and the cuboid side 22 of the radiation-transparent molding 13. A profile milling cutter 16 is arranged in the guiding stub 26 in such a way that, during the lowering in the direction A with simultaneous rotation in the direction B, it can mill a through-opening into the separating wall 15.

Figure 5:
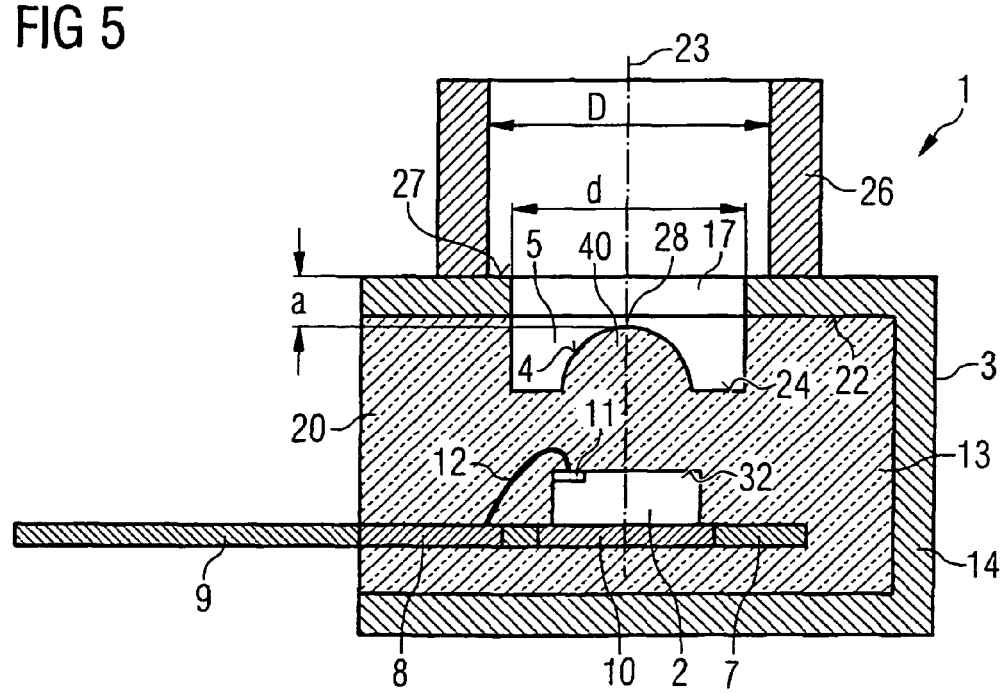
FIG. 5 is a schematic cross section through an optoelectronic component according to a second embodiment of the invention.

FIG. 5 shows a schematic cross section through an optoelectronic component 1 according to a second embodiment of the invention. After the lowering and rotating of the profile milling cutter 16 in FIG. 4, a through-opening 17 is produced in the mold 14 and a clearance 21 is produced in the radiation-transparent molding 13, with a radiation-optical functional surface 4 being formed on the base 34 of the clearance. The inside diameter D of the guiding stub 26 is larger than the diameter d of the through-opening 17 produced. On the remaining mold 14 there is consequently formed a disk-shaped stop face 27, which ensures the distance a between the vertex point 28 of the functional surface 4, which represents a lens 40, and the stop face 27, as a result of which, when the coupling partner is introduced, a distance a of 50 μm is established between an end face (not shown) of the coupling partner and the vertex point 28 of the lens 40. The mold 14 is produced from a non-radiation-transparent material and protects the radiation-transparent molding 13 from mechanical damage and it ensures retention of the coupling partner, not shown in FIG. 5, in an axially symmetrical position in relation to the radiation-optical axis 23 of the optoelectronic transducer 2.

Figure 6:
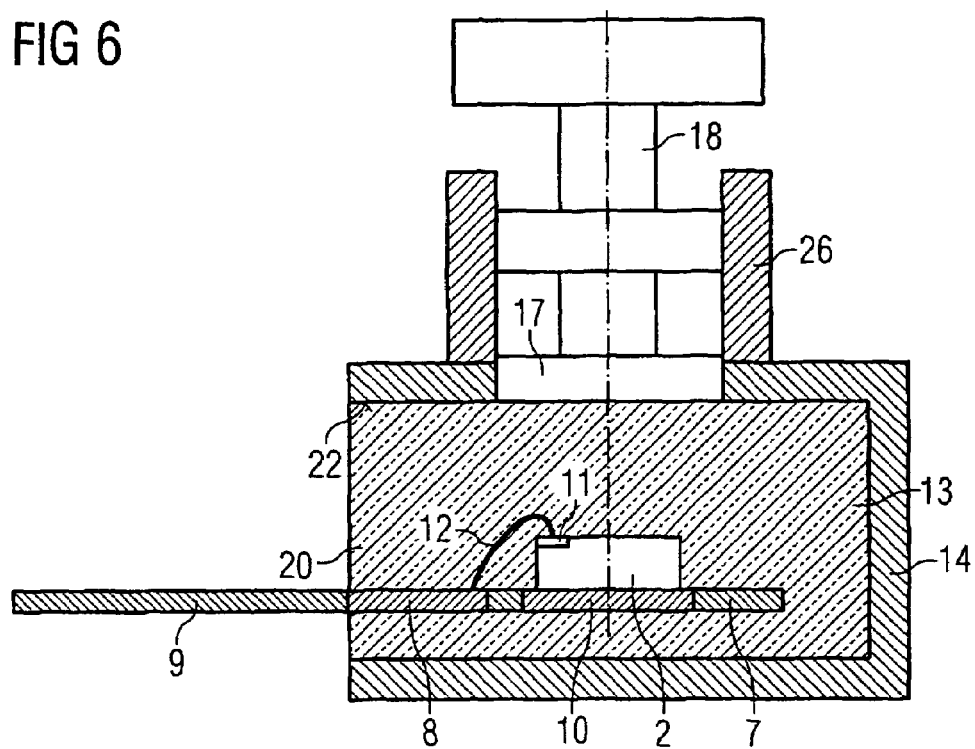
FIG. 6 is a schematic cross section through a casting mold for producing an optoelectronic component.

FIG. 6 shows a schematic cross section through a casting mold for producing an optoelectronic component. In the case of this mold 14, the difference from the mold in FIG. 4 is the guiding stub 26, which is separated by a plug 18 in a through-opening 17 from the radiation-transparent molding 13 when the plastics compound for the radiation-transparent molding 13 is poured in. Before a profile milling cutter is introduced, the plug 18 is removed after introduction of the radiation-transparent molding 13, and a profile milling cutter is introduced in place of the plug, as FIG. 7 shows.

Figure 7:
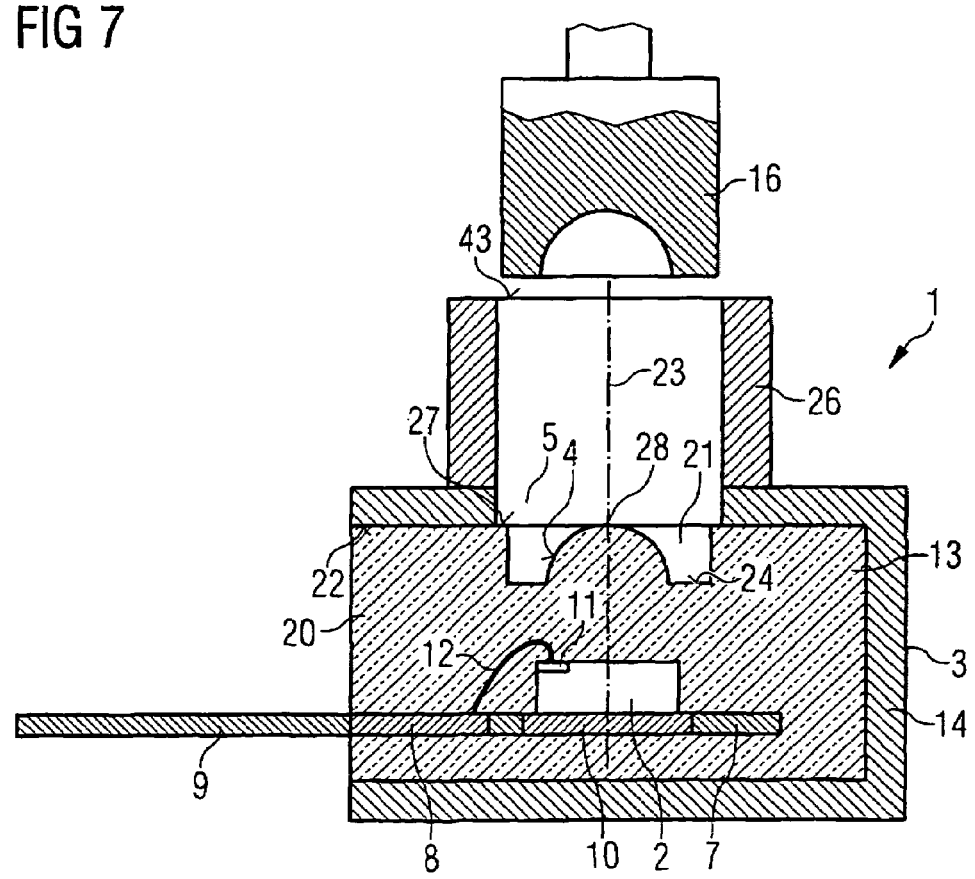
FIG. 7 is a schematic cross section through an optoelectronic component according to a third embodiment of the invention.

FIG. 7 shows a schematic cross section through an optoelectronic component 1 of a third embodiment of the invention. The main difference from the component shown in FIG. 5 is that a stop face 27 is not arranged on the base of the guiding stub 26, as shown in FIG. 5, but instead the stop face 27 is arranged on the cuboid side 22 of the radiation-transparent molding 13. When the profile milling cutter 16 is lowered, in the direction of the arrow A, for forming the clearance 21 in the radiation-transparent molding 13, at the same time a lens is milled, the vertex point 28 of which has a distance of 50 µm from the stop face 27.

Figure 8:
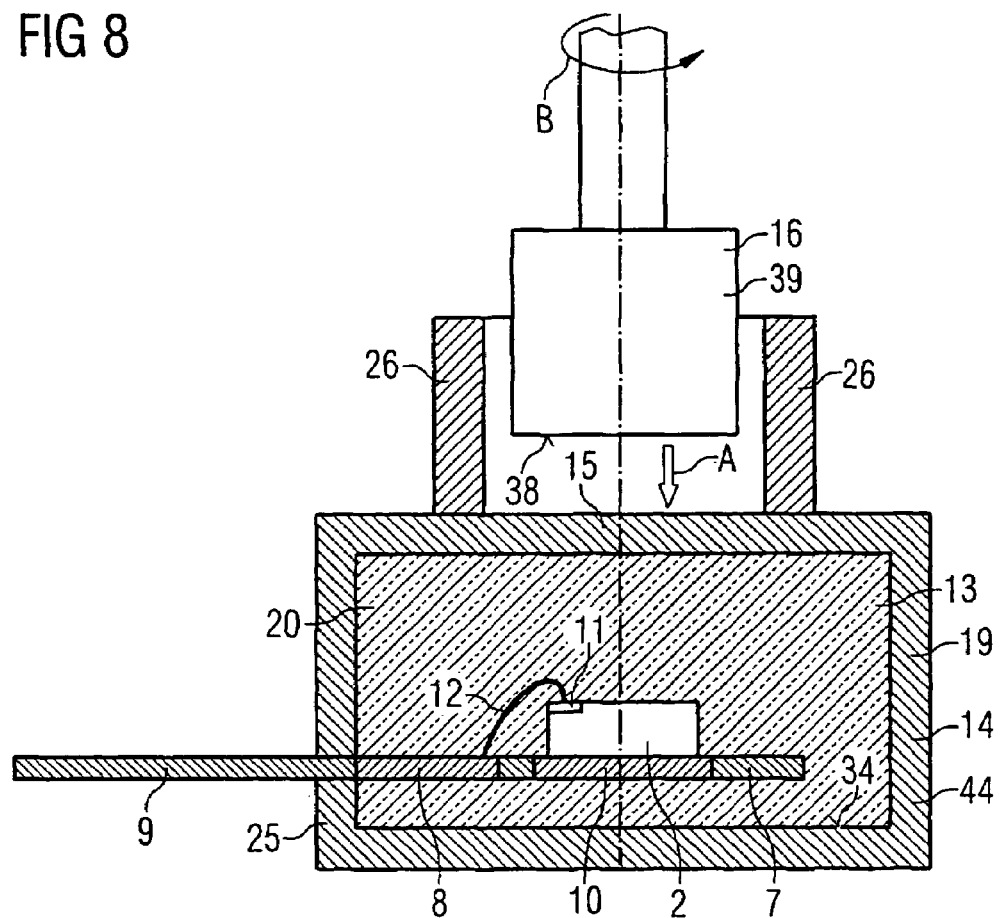
FIG. 8 is a schematic cross section through a casting mold for producing an optoelectronic component.

FIG. 8 shows a schematic cross section through a casting mold 44 for producing an optoelectronic component. While the mold 14 in FIGS. 4 to 7 is formed before the introduction of the plastics material of the radiation-transparent molding 13, in FIG. 8 the radiation-transparent molding 13 is molded first and the casting mold 44 is subsequently molded onto the radiation-transparent molding 13 by a second molding step. Formed at the same time in this case is the guiding stub 26, which is aligned symmetrically in relation to the radiation-optical axis 23 of the optoelectronic transducer 2. As a difference from the milling head 39 shown in FIG. 2, the milling head of FIG. 8 has a continuously planar milling face 38. While rotating in the direction of the arrow B, this milling head 39 is lowered in the direction of the arrow A in the direction of the radiation-transparent body 13, so that a through-opening is milled into the non-radiation-transparent casting mold 44.

Figure 9:
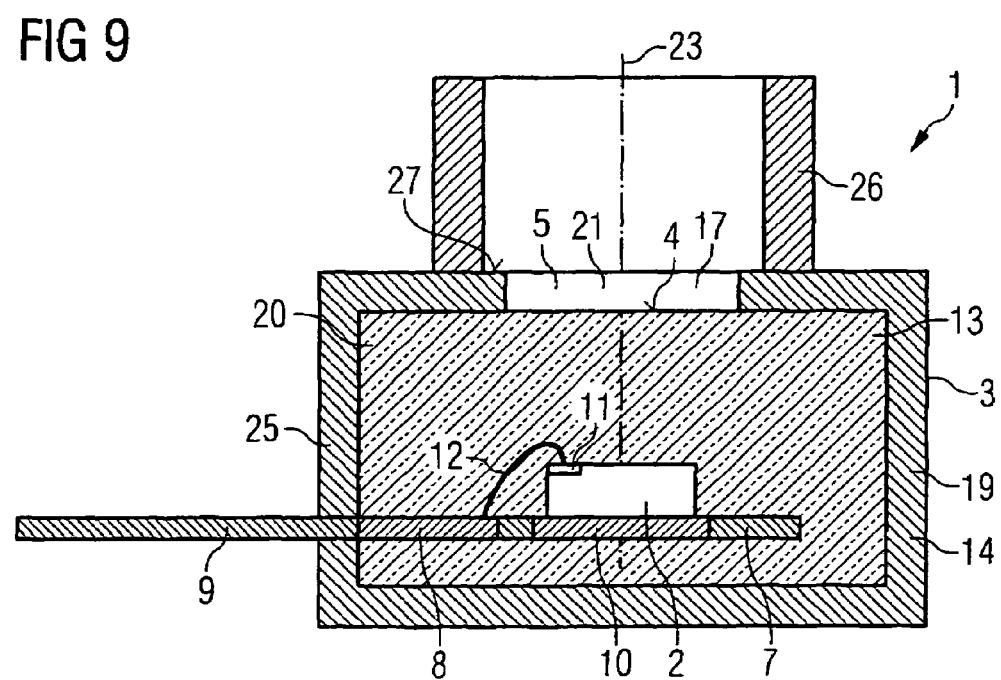
FIG. 9 is a schematic cross section through an optoelectronic component of a fourth embodiment of the invention.

FIG. 9 shows a schematic cross section through an optoelectronic component 1 of a fourth embodiment of the invention. This embodiment of the invention differs from the preceding embodiments in that the radiation-transparent molding 13 is completely surrounded by a non-radiation-transparent casting mold 44 and only the radiation-optical functional surface 4 for the coupling on of a coupling partner is left free. This consequently achieves the effect that no stray optical radiation whatever can disturb the coupling between the coupling partner and the transducer 2 in the case of this embodiment of the invention.

I claim:

1. A method for producing an optoelectronic component, which comprises:

providing an optoelectronic transducer mounted on a support with inner flat conductors and outer flat conductors;

embedding the transducer and the inner flat conductors in a plastic housing;

milling the plastic housing to form a radiation-optical functional surface for a coupling partner from a material of the plastic housing; and prior to the milling step, die-casting an outer enclosure with a guiding stub for the coupling partner onto the plastic housing.

2. The method according to claim 1, which comprises forming the radiation-optical functional surface in alignment with the transducer.

3. A method for producing an optoelectronic component, which comprises:

providing an optoelectronic transducer mounted on a support with inner flat conductors and outer flat conductors;

casting a plastic housing with a guiding stub in a mold, with the guiding stub being separated from the plastic housing by a separating wall;

embedding the transducer and the inner flat conductors in the plastic housing; and milling the plastic housing to form a radiation-optical functional surface for a coupling partner from a material of the plastic housing.

4. The method according to claim 3, which comprises milling a through-opening into the separating wall.

5. The method according to claim 4, which comprises utilizing a milling head having an outer diameter smaller than an inner diameter of the guiding stub for milling, to form a disk-shaped stop face in the through-opening.

6. The method according to claim 5, which comprises aligning the stop face symmetrically relative to a radiation-optical axis.

7. The method according to claim 5, which comprises setting a spacing distance between a vertex point of the optical functional surface and the stop face to between 10 µm and 100 µm.

8. The method according to claim 7, which comprises setting the spacing distance to between 40 µm and 60 µm.

9. The method according to claim 3, which comprises forming the separating wall during the casting of the plastic housing from a plug, and removing the plug before the milling step.

10. The method according to claim 3, which comprises forming the radiation-optical functional surface in alignment with the transducer.

* * * * *